US012695459B2

(12) United States Patent (10) Patent No.: US 12,695,459 B2
Joyce et al. (45) Date of Patent: Jul. 28, 2026

(54) METHOD FOR COMPLEX HARDWARE DEVELOPMENT ERROR MITIGATION VIA INDEPENDENT ANALOG REPRESENTATION OF DIGITAL DATA

(71) Applicant: Hamilton Sundstrand Corporation, Charlotte, NC (US)

(72) Inventors: Thomas P. Joyce, Rockford, IL (US); Brennan Fox, Machesney Park, IL (US); Christopher Gillette, Melbourne, FL (US); John A. Kleindienst, Rockford, IL (US); Alan E. Lubow, Cary, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 155 days.

(21) Appl. No.: 18/378,287

(22) Filed: Oct. 10, 2023

(65) Prior Publication Data
US 2025/0119150 A1 Apr. 10, 2025

(51) Int. Cl.
H03M 1/06 (2006.01)

(52) U.S. Cl.
CPC ................................ H03M 1/0604 (2013.01)

(58) Field of Classification Search
CPC .................................................. H03M 1/0604
See application file for complete search history.

(56) References Cited

U.S. PATENT DOCUMENTS

| | | | | |
|---|---|---|---|---|
| 4,408,133 | A | * | 10/1983 | Cooperman ..... G01R 19/16519 327/535 |
| 4,943,919 | A | | 7/1990 | Aslin et al. |
| 5,499,027 | A | * | 3/1996 | Karanicolas ........ H03M 1/1061 341/162 |
| 5,600,576 | A | | 2/1997 | Broadwater et al. |
| 6,151,567 | A | | 11/2000 | Ames et al. |
| 6,956,517 | B1 | * | 10/2005 | Baker ................. H03M 1/0626 341/120 |

(Continued)

FOREIGN PATENT DOCUMENTS

| | | |
|---|---|---|
| EP | 4220963 A2 | 8/2023 |
| KR | 10-2005-0094066 A | 9/2005 |

OTHER PUBLICATIONS

European Search Report dated Mar. 13, 2025 in connection with European Patent Application No. 24202700.1, 10 pages.

(Continued)

*Primary Examiner* — Thomas D Alunkal

(57) ABSTRACT

A system an analog to digital converter (ADC) operatively connected to receive an analog input signal from an input line and to output a digital input signal. A processor is operatively connected to receive the digital input signal from the ADC and to output a digital control signal for controlling a physical system based on the digital input signal. A digital to analog converter (DAC) is operatively connected to receive a copy of the digital input signal put out from the processor, and to output an analog output signal indicative of the copy of the digital input signal put out from the processor. Comparison logic is operatively connected to receive the analog input signal from the input line, to receive the analog output signal from the DAC, and to output an error signal in response to a mismatch between the analog input signal and the analog output signal.

20 Claims, 2 Drawing Sheets

(56)     References Cited

U.S. PATENT DOCUMENTS

| | | | |
|---|---|---|---|
| 7,623,053 B2 * | 11/2009 | Terry .................... | H03M 3/434 |
| | | | 341/143 |
| 8,489,306 B2 * | 7/2013 | Sahm ........................ | F02C 9/42 |
| | | | 701/99 |
| 9,048,860 B1 * | 6/2015 | Quinn ..................... | H03M 1/46 |
| 9,397,693 B1 * | 7/2016 | Jain ....................... | H03M 1/125 |
| 9,880,529 B2 | 1/2018 | Girardeau, Jr. | |
| 9,998,134 B1 * | 6/2018 | Stepanovic ......... | H03M 1/1014 |
| 10,778,162 B1 | 9/2020 | Sengodan et al. | |
| 10,931,299 B1 * | 2/2021 | Kinyua ................. | H03M 3/412 |
| 2005/0001684 A1 * | 1/2005 | Braithwaite .......... | H03F 1/3247 |
| | | | 330/263 |
| 2023/0090583 A1 | 3/2023 | Joyce et al. | |
| 2023/0223949 A1 * | 7/2023 | Rubinsztain ....... | G01R 33/0029 |
| | | | 341/155 |

OTHER PUBLICATIONS

Kester et al., "Data Conversion Handbook—Section 5. Testing Data Converters," Elsevier Science & Technology, Dec. 2004, 76 pages.

* cited by examiner

METHOD FOR COMPLEX HARDWARE DEVELOPMENT ERROR MITIGATION VIA INDEPENDENT ANALOG REPRESENTATION OF DIGITAL DATA

BACKGROUND

1. Field

The present disclosure relates to digital control systems, and more particularly to control systems such as those used in aerospace applications.

2. Description of Related Art

Aerospace certification authorities are increasingly stringent regarding consideration of development errors associated with complex hardware devices. This may dictate the need to consider scenarios in which the complex device cannot be trusted to behave as per its intended function and per its requirements, and may behave unpredictably causing worst-case system-level effects. Coupled with this is the consideration that many aerospace products use common complex hardware devices for multiple functions within a LRU (line replaceable unit) and multiple of the same LRU within an aircraft.

The conventional techniques have been considered satisfactory for their intended purpose. However, there is an ever present need for improved systems and methods for development error mitigation such as in complex hardware designs. This disclosure provides a solution for this need.

SUMMARY

A system includes an input line. An analog to digital converter (ADC) is operatively connected to receive an analog input signal from the input line and to output a digital input signal representative of the analog input signal. A processor is operatively connected to receive the digital input signal from the ADC and to output a digital control signal for controlling a physical system based on the digital input signal. A digital to analog converter (DAC) is operatively connected to receive a copy of the digital input signal put out from the processor, and to output an analog output signal indicative of the copy of the digital input signal put out from the processor. Comparison logic is operatively connected to receive the analog input signal from the input line, to receive the analog output signal from the DAC, and to output an error signal in response to a mismatch between the analog input signal and the analog output signal.

The processor can be a microprocessor, a digital signal processor (DSP), field programmable gate array (FPGA), or the like. An analog math component can be included in a signal lane connecting the analog input line to the comparison logic. The processor can include a math function that matches a math function in the analog math component.

The comparison logic can include a first signal conditioner operatively connected to receive the analog input signal and output a conditioned analog input signal, and a second signal conditioner operatively connected to receive the analog output signal and to output a conditioned analog output signal. The comparison logic can include a difference amplifier operatively connected to receive the conditioned analog input signal, to receive the conditioned analog output signal, and to output a difference signal. The comparison logic can include a window comparator operatively connected to receive the difference signal, to compare the difference signal to a predetermined window, and to output an error signal in response to the difference signal being outside the predetermined window.

The comparison logic can include a latch having a set input, a reset input, and an latch output. The set input can be operatively connected to receive the error signal from the window comparator. The reset input can be operatively connected to receive a reset command to reset the latch after clearing an error. The latch can be configured to output a trip signal indicative of an error in the processor in response to receiving the error signal until receiving the reset command.

The analog input can include multiple lanes, into the ADC and into the first signal conditioner. Output analogs of the multiple lanes can be conducted from the DAC to the second signal conditioner. The difference amplifier can be a first difference amplifier configured to receive a first one of the multiple lanes and a first one of the a first one of the output analogs from the second signal conditioner. The comparison logic can include at least one additional difference amplifier so there is one respective one of the difference amplifiers for each of the multiple lanes operatively connected to receive one of the multiple lanes and one of the output analogs. The window comparator can be a first window comparator. The comparison logic can include at least one additional window comparator. Each of the window comparators can be operatively connected to receive output from a respective one of the difference amplifiers and to output a respective error signal to a shared OR gate. The shared OR gate can be configured to output an error signal in response to any one or more of the error signals being input to the OR gate. Each of the multiple lanes can carry an AC phase. The system can be a bus power control unit (BPCU), wherein the physical system is a power bus aboard an aircraft.

The analog input can be operatively connected to convey output from an aircraft sensor aboard an aircraft, and the physical system can be aboard the aircraft. The sensor can be an air data sensor, and the physical system can be a gas turbine engine. The processor can be configured to control performance parameters of the gas turbine engine based on feedback from the air data sensor. The sensor can be a voltage and/or current sensor connected to a POR (point of regulation) in an output line of a generator. The system can be a generator control unit (GCU) in which the processor is configured to control performance parameters of the generator based on feedback from the voltage and/or current sensor.

A method includes receiving an analog input signal, converting the analog input signal into a digital input signal, processing the digital input signal to produce a control signal for controlling a physical parameter of an aircraft system, converting the digital input signal from a processor into an analog output signal, and conditioning the analog output signal into a conditioned analog output signal. The method includes converting the analog input signal into a conditioned analog input signal, comparing the conditioned analog input signal to the conditioned analog output signal to detect a discrepancy, and outputting an error signal in response to detecting the discrepancy.

Comparing the conditioned analog input signal to the conditioned analog input signal can include using a difference amplifier. Comparing the conditioned analog input signal to the conditioned analog output signal can include using a window comparator operatively connected to receive a difference signal from the difference amplifier to compare the difference signal to a predetermined window and to output the error signal in response to the difference signal being outside the predetermined window.

Controlling the physical parameter of an aircraft system can include controlling a power bus. The analog input can be received from an air data sensor. Controlling a physical parameter of an aircraft system can include controlling performance parameters of a gas turbine engine based on feedback from the air data sensor. The analog input can be received from a voltage and/or current sensor connected to a POR (point of regulation) in an output line of a generator. Controlling a physical parameter of an aircraft system can include controlling performance parameters of the generator based on feedback from the voltage and/or current sensor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
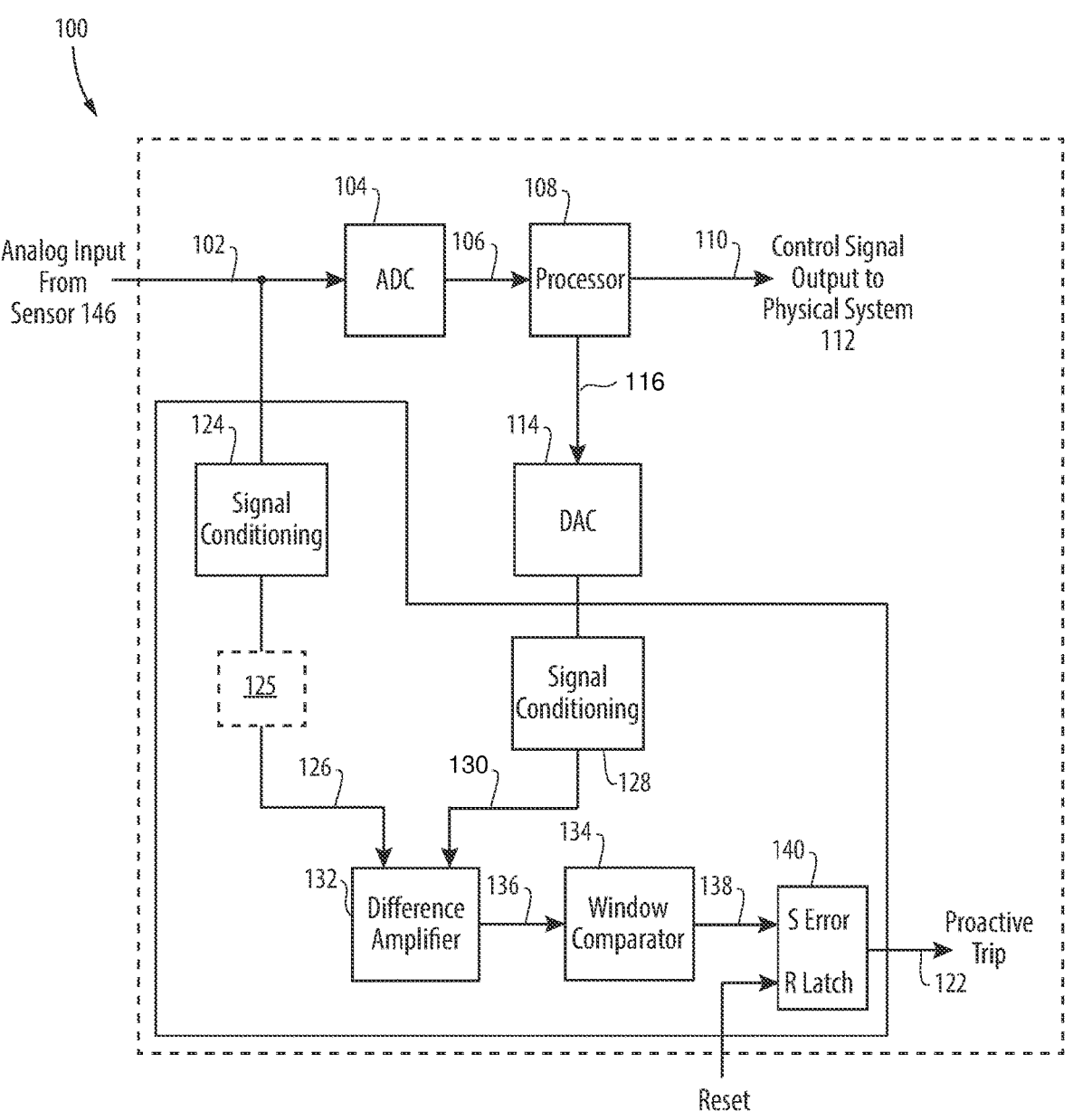
FIG. 1 is a schematic view of an embodiment of a system constructed in accordance with the present disclosure, showing the analog to digital converter (ADC) and the digital to analog converter (DAC)

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2, as will be described. The systems and methods described herein can be used to mitigate possible development errors which may be required to be mitigated based on certification authority and safety guidelines.

To mitigate the possibility of development errors that potentially cause worst-case system-level effects, design features with independence from the complex hardware item can be added to a design. These design features can protect against erroneous operation of the complex hardware item. One such error scenario is the possibility of analog data that has been digitized within the complex hardware item becoming corrupted and leading to erroneous system operation. As disclosed herein, this can be protected against by adding an independent hardware item which monitors the digitized analog data within the complex hardware item against the analog signal outside of the device. This can be accomplished by transmitting the digitized data within the complex hardware item to a digital-to-analog converter (DAC), then using signal conditioning and comparator circuitry to indicate a fault when the difference between the two signals is larger than a threshold value. The output of the comparator circuitry can be used to latch a fault and place the line replaceable unit (LRU) and/or system into a known and predictable state.

With reference now to the configuration in FIG. 1, the system 100 includes an input line 102. An analog to digital converter (ADC) 104 is operatively connected to receive an analog input signal from the input line 102 and to output a digital input signal representative of the analog input signal, e.g. through line 106. A processor 108 is operatively connected to receive the digital input signal from the ADC 104 and to output a digital control signal, e.g. in line 110, for controlling a physical system 112 based on the digital input signal. The processor 108 can be a microprocessor, a digital signal processor (DSP), field programmable gate array (FPGA), or any other suitable type of processor.

A digital to analog converter (DAC) 114 is operatively connected, by line 116, to receive a copy of the digital input signal put out from the processor 108. Through line 118, the DAC 114 outputs an analog output signal indicative of the copy of the digital input signal put out from the processor 108. Comparison logic 120 is operatively connected to receive the analog input signal from the input line 102, to receive the analog output signal from the DAC 114, and to output an error signal, e.g. the proactive trip in line 122, in response to a mismatch between the analog input signal in line 102 and the analog output signal in line 118.

The comparison logic 120 includes a first signal conditioner 124 operatively connected to receive the analog input signal from line 102, and to output a conditioned analog input signal in line 126. A second signal conditioner 128 is operatively connected to receive the analog output signal from line 118 and to output a conditioned analog output signal in line 130. The signal conditioners 124, 128 of the comparison logic 120 are configured to scale and/or condition analog signals as needed. The comparison logic 120 includes a difference amplifier 132 operatively connected to receive the conditioned analog input signal from line 126, to receive the conditioned analog output signal from line 130, and to output a difference signal indicative of the difference between the two signals from lines 126 and 130. The comparison logic 120 includes a window comparator 134 operatively connected to receive the difference signal from the difference amplifier through the line 136, and to compare the difference signal to a predetermined window indicating a maximum allowable absolute value of difference. If the difference from the difference amplifier exceeds the predetermined window, the window comparator 134 outputs an error signal in line 138 in response to the difference signal being outside the predetermined window. In this way, system 100 compares the conditioned analog input signal to the conditioned analog output signal to detect a discrepancy, and outputs an error signal in response to detecting the discrepancy.

The comparison logic 120 can include a latch 140 having a set input S, a reset input R, and an latch output, i.e. line 122. The set input S is operatively connected to receive the error signal from the window comparator 138 via line 138. The reset input R is operatively connected to receive a reset command to reset the latch 140 after clearing an error, e.g. so an automated system, ground crew personnel, or flight crew personnel can clear the error after it is resolved. The latch 140 is configured to output a proactive trip signal via line 122 indicative of an error in the processor 108 in response to receiving the error signal, which trip signal persists until receiving the reset command or removal of its power supply.

Figure 2:
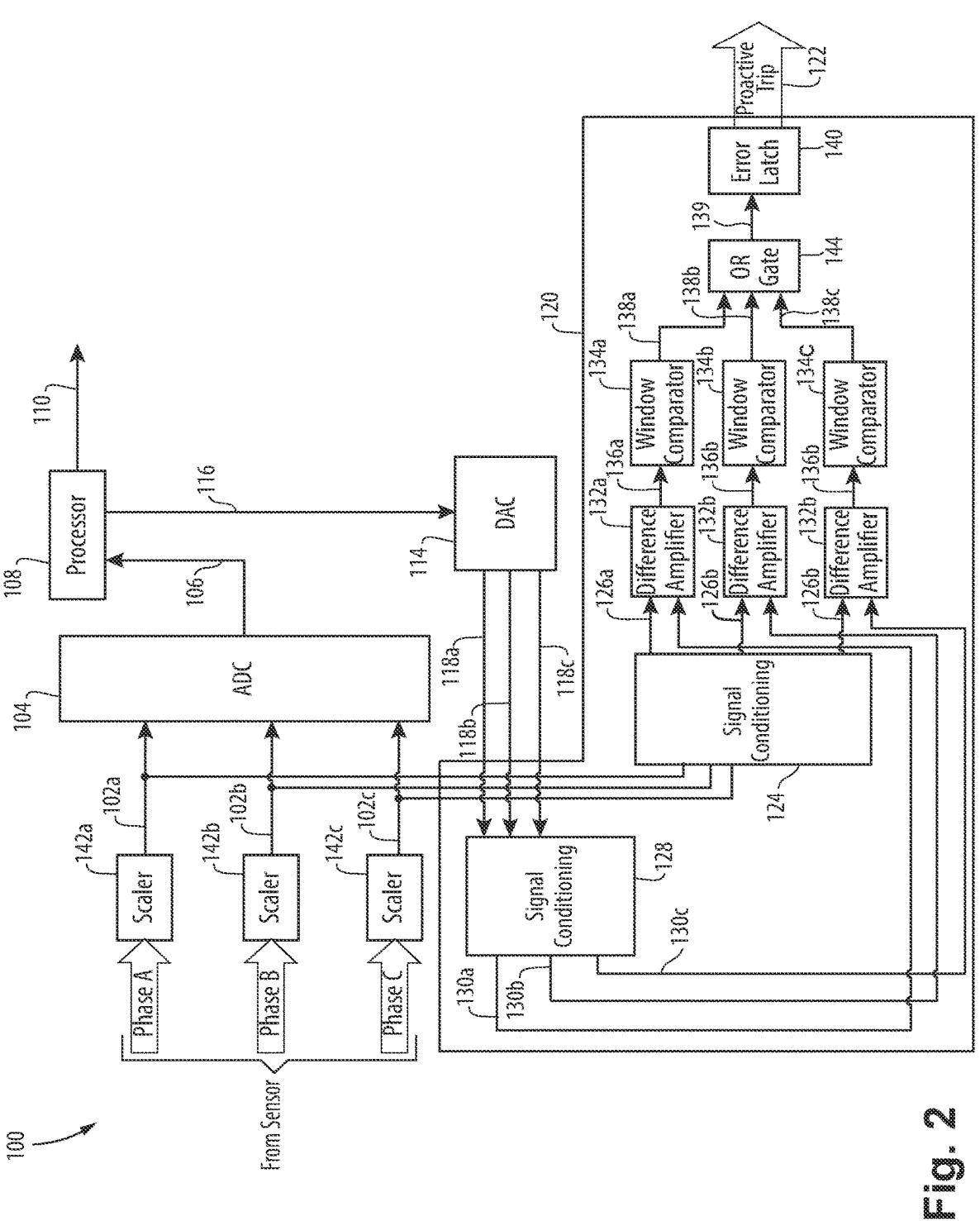
FIG. 2 is a schematic view of an embodiment of the system of FIG. 1, showing a configuration for a power bus with lanes for three phases of alternating current.

With reference now to the configuration in FIG. 2, a Bus Power Control Unit (BPCU) which controls the external power applied to a power bus aboard an aircraft, is an example of a system 100 with critical analog data wherein the 3-Phase AC power is an input to the BPCU. Each phase A, B, C is scaled in a respective scaler 142*a*, 142*b*, 142*c*, then fed through an Analog to Digital converter (ADC) 104 through three analog input lines 102*a*, 102*b*, 102*c*. The ADC 104 sends the representative digital signals to the processor 108 much as described above with reference to FIG. 1. This digital input signals are fed back through a DAC 114, and compared to the pre-ADC levels for error, much as described above with reference to FIG. 1, except that the analog lines 102, 118, 126, 130, 136, and 138 are each replaced with three respective separate lines 102*a*, 102*b*, 102*c*, 118*a*, 118*b*, 126*a*, 126*b*, 126*c*, 118*c*, 130*a*, 130*b*, 130*c*, 136*a*, 136*b*, 136*c*, 138*a*, 138*b*, 138*c* to maintain three separate analog lanes through the comparison logic 120. The three lanes conduct analog signals into the ADC 104 and into the first signal conditioner 124. Output analogs of the multiple lanes are conducted from the DAC 114 to the second signal conditioner 128. The comparison logic 120 the multiple lane configuration includes a respective difference amplifier 132*a*, 132*b*, 132*c* so there is one respective difference amplifier for each of the multiple lanes operatively connected to receive one of the multiple lanes and one of the output analogs, e.g. the difference amplifier 132*a* compares the analog signals for phase A received in lines 126*a*, 130*a*, and so forth for all three lanes. Similarly, the three lane configuration includes a respective window comparator 134*a*, 134*b*, 134*c* for each lane. Each of the window comparators 134*a*, 134*b*, 134*c* is operatively connected to receive output from a respective one of the difference amplifiers 132*a*, 132*b*, 132*c* and to output a respective error signal 138*a*, 138*b*, 138*c* to a shared OR gate 144. The shared OR gate 144 is configured to output an error signal in line 139 to a latch 140, which can output the the proactive trip 122 as described above with reference to FIG. 1, in response to any one or more of the error signals in lines 138*a*, 138*b*, 138*c* being input to the OR gate 144.

With reference again to FIG. 1, the analog input can be operatively connected to convey output from a sensor 146 aboard an aircraft, and wherein the physical system 112 is also aboard the aircraft. The sensor 146 can be an air data sensor, the physical system 112 can be a gas turbine engine, and the processor 108 can be configured to control performance parameters of the gas turbine engine 112 based on feedback from the air data sensor 146. The sensor 146 can be a voltage and/or current sensor connected to a POR (point of regulation) in an output line of a generator, which can be the physical system 112 controlled by the system 100. The system 100 can be a generator control unit (GCU) in which the processor 108 is configured to control performance parameters of the generator 112 based on feedback from the voltage and/or current sensor 146.

If the processor 108 performs any math on the digital signal from line 106 before outputting it to the DAC 114, a corresponding analog math component 125 can be included in the signal lane or lanes connecting the analog input line 102 to the comparison logic. The analog math component 125 can be located, e.g. as indicated by the broken-line box in FIGS. 1 and 2, either in the line 126 or in the branch of line 102 connected to the signal conditioning 124 (and similarly positioned in the case of multiple analog lanes of FIG. 2). In this case, the processor 108 includes a digital math function that matches a math function in the analog math component 125. This analog block 125 can perform an analog math function on the analog signal(s) to match the intended math performed on the digital signal in the processor that is output to the DAC 114, so that if there are no development errors in the processor 108, there should be no mismatch in the difference amplifier 132 or window comparator 134, otherwise if there is a mismatch, the proactive trip 122 can signal the error.

The methods and systems of the present disclosure, as described above and shown in the drawings, provide for mitigation of possible development errors which may be required to be mitigated based on certification authority and safety guidelines. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
   a separate input line for each of multiple components of an analog input signal;
   an analog-to-digital converter (ADC) operatively connected to receive the multiple components of the analog input signal from the separate input lines and to output a digital input signal representative of the analog input signal;
   a processor operatively connected to receive the digital input signal from the ADC and to output a digital control signal for controlling a physical system based on the digital input signal;
   a digital-to-analog converter (DAC) operatively connected to receive a copy of the digital input signal from the processor and to output a corresponding analog output signal for each component of the analog input signal indicative of the copy of the digital input signal from the processor; and
   comparison logic including:
      a first signal conditioner operatively connected to receive the multiple components of the analog input signal from the separate input lines and output corresponding conditioned analog input signals;
      a second signal conditioner operatively connected to receive the analog output signals from the DAC and to output corresponding conditioned analog output signals; and
      for each component of the analog input signal:
         a respective difference amplifier operatively connected to receive the corresponding conditioned analog input signal, to receive the corresponding conditioned analog output signal, and to output a difference signal; and
         a respective window comparator operatively connected to receive the difference signal, to compare the difference signal to a predetermined window, and to output a respective error signal to a shared OR gate in response to the difference signal being outside the predetermined window;
   wherein the shared OR gate is configured to output an error signal in response to any one or more of the respective error signals being input to the shared OR gate.

2. The system as recited in claim 1, wherein the processor is a microprocessor, digital signal processor (DSP) or field programmable gate array (FPGA).

3. The system as recited in claim 1, further comprising, for at least one of the separate input lines, an analog math component in a signal lane connecting the separate input line to the comparison logic, wherein the processor includes a math function that matches a math function of the analog math component.

4. The system as recited in claim 1, wherein the comparison logic includes a latch having a set input, a reset input, and an latch output, wherein the set input is operatively connected to receive the error signal from the shared OR gate, wherein the reset input is operatively connected to receive a reset command to reset the latch after clearing an error, and wherein the latch is configured to output a trip signal indicative of an error in the processor in response to receiving the error signal until receiving the reset command.

5. The system as recited in claim 1, wherein each of the multiple components of the analog input signal is an AC phase.

6. They system as recited in claim 5, wherein the system is a bus power control unit (BPCU) and wherein the physical system is a power bus aboard an aircraft.

7. The system as recited in claim 1, wherein the analog input signal is operatively connected to convey output from an aircraft sensor aboard an aircraft, and wherein the physical system is aboard the aircraft.

8. The system as recited in claim 7, wherein the sensor is an air data sensor, wherein the physical system is a gas turbine engine, and wherein the processor is configured to control performance parameters of the gas turbine engine based on feedback from the air data sensor.

9. The system as recited in claim 7, wherein the sensor is a voltage and/or current sensor connected to a point of regulation (POR) in an output line of a generator, and wherein the system is a generator control unit (GCU) in which the processor is configured to control performance parameters of the generator based on feedback from the voltage and/or current sensor.

10. A method comprising:

receiving multiple components an analog input signal;

converting the multiple components of the analog input signal into a digital input signal;

processing the digital input signal to produce a control signal for controlling a physical parameter of an aircraft system;

converting the digital input signal by a processor into a corresponding analog output signal for each component of the analog input signal;

conditioning, with a first signal conditioner, the analog output signals into corresponding conditioned analog output signals;

converting, with a second signal conditioner, the multiple components of the analog input signal into corresponding conditioned analog input signals;

for each of the multiple components of the analog input signal:

comparing the corresponding conditioned analog input signal to the corresponding conditioned analog output signal using a respective difference amplifier;

comparing, by a respective window comparator operatively connected to receive a difference signal from the respective difference amplifier, the difference signal to a predetermined window; and outputting a respective error signal from the respective window comparator to a shared OR gate in response to the difference signal being outside the predetermined window; and outputting an error signal from the shared OR gate in response to any one or more of the respective error signals being input to the shared OR gate.

11. The method as recited in claim 10, wherein controlling the physical parameter of the aircraft system includes controlling a power bus.

12. The method as recited in claim 10, wherein the analog input signal is received from an air data sensor, and wherein controlling the physical parameter of the aircraft system includes controlling performance parameters of a gas turbine engine based on feedback from the air data sensor.

13. The method as recited in claim 10, wherein the analog input signal is received from a voltage and/or current sensor connected to a point of regulation (POR) in an output line of a generator, and wherein controlling the physical parameter of the aircraft system includes controlling performance parameters of the generator based on feedback from the voltage and/or current sensor.

14. The method as recited in claim 10, wherein the processor is a microprocessor, digital signal processor (DSP) or field programmable gate array (FPGA).

15. The method as recited in claim 10, further comprising:

performing a digital math function on the digital input signal; and performing an analog math function on at least one of the multiple components of the analog input signal that matches the digital math function performed on the digital input signal.

16. The method as recited in claim 10, further comprising:

receiving the error signal from the shared OR gate at a set input of a latch; and outputting a trip signal from the latch indicative of an error in the processor in response to receiving the error signal.

17. The method as recited in claim 16, further comprising:

receiving a reset command at a reset input of the latch; and discontinuing to output the trip signal from the latch in response to receiving the reset command at the reset input of the latch.

18. The method as recited in claim 10, wherein each of the multiple components of the analog input signal is an AC phase.

19. The method as recited in claim 11, wherein the method is performed by a bus power control unit (BPCU).

20. The method as recited in claim 13, wherein the method is performed by a generator control unit (GCU).

* * * * *